United States Patent [19]

Jones et al.

[11] 4,139,051

[45] Feb. 13, 1979

[54] METHOD AND APPARATUS FOR THERMALLY STABILIZING WORKPIECES

[75] Inventors: Addison B. Jones, La Mirada; William R. Fewer, West Covina, both of Calif.

[73] Assignee: Rockwell International Corporation, El Segundo, Calif.

[21] Appl. No.: 721,121

[22] Filed: Sep. 7, 1976

[51] Int. Cl.$^2$ ............................................. F28F 13/18
[52] U.S. Cl. ........................................... 165/1; 29/559; 165/80; 165/133; 165/185; 269/21
[58] Field of Search ................... 165/80, 185, 47, 133, 165/1; 269/21; 29/559

[56] References Cited

U.S. PATENT DOCUMENTS

| | | | |
|---|---|---|---|
| 2,935,666 | 5/1960 | Van Namen | 165/185 |
| 3,187,812 | 6/1965 | Staver | 165/185 |
| 3,301,315 | 1/1967 | Webb | 165/185 |
| 3,509,429 | 4/1970 | Craig et al. | 165/185 |
| 3,586,102 | 6/1971 | Gilles | 165/185 |
| 3,617,045 | 11/1971 | DaCosta | 269/21 |

*Primary Examiner*—Charles J. Myhre
*Assistant Examiner*—Margaret LaTulip
*Attorney, Agent, or Firm*—G. Donald Weber, Jr.; H. Fredrick Hamann

[57] ABSTRACT

A method and apparatus for providing temporary thermal contact between a part being processed and a heat sink is disclosed. A tacky, insert, polymer film is applied to establish intimate contact with the part and the heat sink. Since the polymer layer has greater cohesive strength than adhesive strength, the part may be separated cleanly from the polymer film with substantially no contamination. The part does adhere with sufficient force to permit improved processing such as ion etching, sputter deposition and etching, ion beam deposition, vacuum evaporation, plasma etching, reactive ion etching, chemical vapor deposition, and ion implantation without overheating. The heat sink is mounted in a supporting fixture having pressure means and vacuum means associated therewith. The vacuum means is used for pulling the device wafer onto the coated heat sink. The pressure means is used to dismount the wafer from the heat sink without physical damage or contamination.

12 Claims, 3 Drawing Figures

METHOD AND APPARATUS FOR THERMALLY STABILIZING WORKPIECES

BACKGROUND OF THE INVENTION

1. Field of the Invention

This invention relates to the processing of device wafers where temperature must be carefully controlled during processing and, more particularly, to the utilization of non-contaminating, inert, polymer films to provide for thermal conduction from device wafers to a heat sink during processing.

2. Description of Prior Art

The field of semiconductor device fabrication includes several fabrication steps where substantial heat is generated. These steps include, for example, sputter deposition or etching, ion beam etching, vacuum evaporation, plasma etching, chemical vapor deposition, ion implantation and the like.

When fabricating semiconductor devices, the temperature must often be maintained at or close to a certain value. During etching by the techniques mentioned above, power inputs in the order of 0.1–1 watt/cm$^2$ are commonly encountered. If photoresist etch masks are used, the temperature must be held below some maximum value to prevent loss of integrity of the photoresist pattern.

Likewise, ion beam etching, sometimes called ion milling, is used in place of wet chemical etching to define high resolution circuit patterns. During this process, high energy ions bombard the surface of the wafer on which a protective pattern has been formed in photoresist or electron resist, thus removing material from the unprotected portion of the device wafer by a momentum transfer process known as physical sputtering. The power density of this ion bombardment is typically in the neighborhood of one watt per cm$^2$, about 95 percent of which is converted to heat. Thus, the device wafer will rapidly heat up, destroying the resist pattern.

The methods which are currently employed to avoid the harmful effects of heating during ion beam etching are reduction of etch rate, use of heat impervious masking patterns instead of photoresist or electron-sensitive resist, and the use of liquid metals (such as gallium or gallium-indium alloys) or a grease or wax between the wafer and the heat sink as a medium to assure good thermal contact. Each of those methods has significant drawbacks. Reduction of milling rate to lower the rate of heating is generally unacceptable since material removal rates must be limited to typically 10–50 A/min. for resist protection. This rate results in extremely long ion etching cycle times for typical thin films several thousand angstroms thick. Use of a metal etch mask pattern instead of a resist pattern merely adds processing steps and shifts the problem to that of producing the metal pattern on the wafer and removing it after ion beam etching. Photoresist is used to form the metal mask pattern, and if it is a high resolution pattern, a technique such as ion etching must be used to etch the mask, so nothing is gained. The use of vacuum grease or gallium to provide thermal contact between wafer and heat sink is currently the most popular method of limiting the temperature excursion of a wafer being ion etched. However, the process of applying and removing the contacting medium is messy and labor consuming and inevitably has a negative impact on yield. The additional labor required to implement these cooling techniques is generally an equal tradeoff at best for the time gained by somewhat greater processing rates.

Thus, there is a need to utilize processes and tooling which are not complex for improving the temporary thermal conduction between the device wafer and the mounting surface without introducing additional steps or contamination and yet assuring no physical damage of the device wafer during dismounting or damage to the resist masks during the fabrication processes.

SUMMARY OF THE INVENTION

This invention relates to methods and apparatus for temporary thermal grounding of device wafers to a heat sink during processes like sputtering ion milling, ion implanting, vacuum evaporation, plasma etching, chemical etching and vapor disposition. The heat sink is mounted on a supporting fixture and is coated with a thin, tacky, inert polymer film. The heat sink includes an aperture which is selectively connected to a vacuum source or a pressure source. The vacuum source is utilized to position the device wafer in intimate contact with the coated heat sink. Positive pressure can be applied to float the wafer off the heat sink such that the dry, chemically inert, polymer film leaves substantially no residue on the wafer after removal from the heat sink. Therefore, no special cleaning step is required and the etching rates are substantially increased without overheating because of the improved thermal conduction.

DETAILED DESCRIPTION

Figure 1:
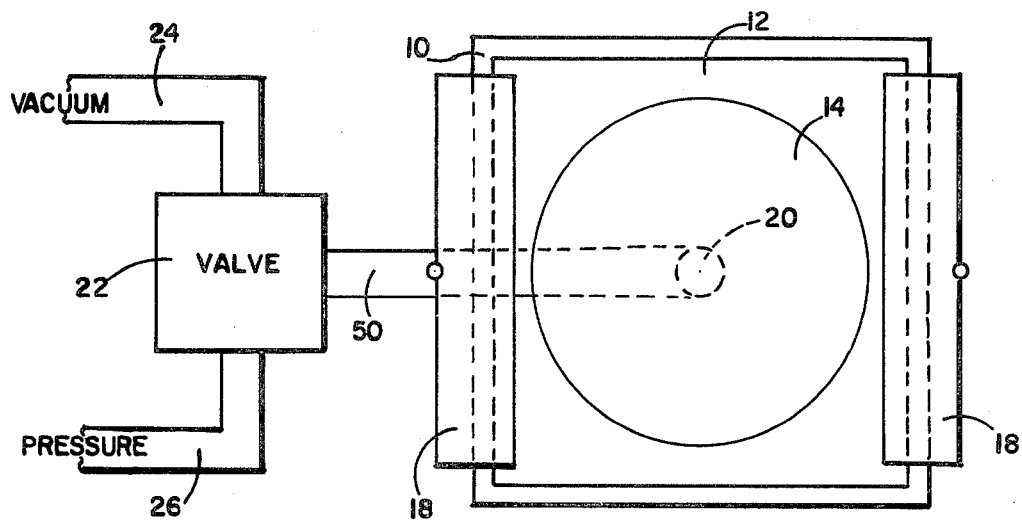
FIG. 1 is a top view of an illustrative embodiment of this invention.
Figure 2:
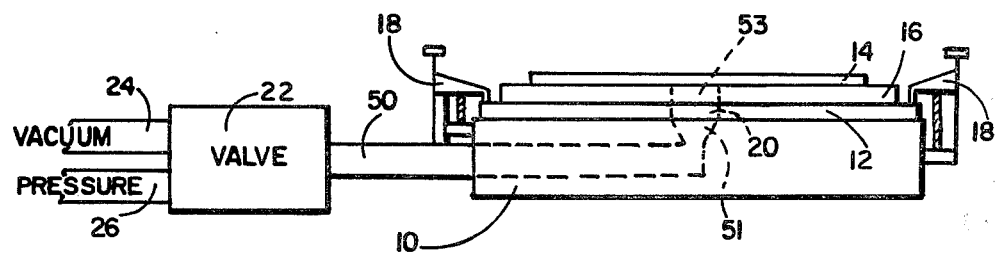
FIG. 2 is a side view of an illustrative embodiment of this invention.

Referring to FIGS. 1 and 2, there is shown mounting fixture 10 for supporting heat sink 12 and device wafer 14. Mounting fixture 10 may be formed from any suitable material such as stainless steel and includes aperture 51 substantially centrally located therein. Heat sink 12 is positioned on fixture 10 and is selectively secured thereto by clamps 18. Heat sink 12, shown as a platen in this embodiment, is fabricated of suitable heat transferring or dissipating material, such as copper. Heat sink 12 includes therein aperture 20 which communicates with aperture 51 in mounting fixture 10. Aperture 51 is connected to 3-way valve 22 by conduit 50. By manipulating valve 22, a vacuum may be pulled, through line 24, at aperture 20 or a positive pressure may be applied through line 26. A vacuum is used to pull wafer 14 into snug, intimate contact with polymer film 16 on heat sink 12. A positive pressure is used to lift wafer 14 from the polymer film. Of course, more than one aperture can be used for either or both operations.

In one embodiment, the top surface of heat sink 12 is coated with a dry, chemically inert, polymer thin film 16. Polymer film 16 is generally applied by the well known silk screen process. The silk screen process is preferred because it produces uniform thin films. Other suitable application means and methods may be utilized such as plasma deposition, vapor deposition, roller coating, or spray deposition, if desired. A dry polymer film of several thousandths of an inch thickness (e.g. 0.004") is preferred.

In another embodiment, polymer layer 16 may be originally applied to the part or wafer 14. Conversely, the polymer thermal contacting layers may be in the form of a separate thin disk (not shown) which is placed between heat sink 12 and wafer 14 prior to processing.

When wafer 14 is placed on heat sink 12 (with a polymer layer 16 therebetween), valve 22 is opened to permit a vacuum to pull wafer 14 into intimate contact with the polymer-coated heat sink 12. The function of the tacky polymer layer is to conform and adhere to the surfaces of the wafer to provide a path for thermal conduction. Polymers are not, in general, excellent thermal conductors. Consequently, the polymer layer should be as thin as possible. However, the layer must have sufficient thickness to accommodate the anticipated deviation from a perfect match between the mating profiles of wafer 14 and heat sink 12. The polymer film chosen is a contact and thermal transfer medium which must possess certain properties. Most important of these are the ability to conform to the mating surfaces to provide the maximum possible surface area for heat transfer, and a higher value of internal cohesion than of adhesion to the surface of the part so that a minimum, if any, of residue will remain on the part after separation.

Once initial contact has been established between heat sink 12 and wafer 14 the vacuum is turned off and the polymer layer, by itself, maintains thermal contact. Device wafer 14, of course, as well as heat sink 12, should have a flat surface. It has been found that polymer film 16 of about 0.004" thick on heat sink 12 will conform and adhere to device wafer 14 with forces of several hundred thousand dynes/cm$^2$ after removal of the vacuum. This adhesive permits the suspension of the parts upside down, if desired, in a vacuum environment without the aid of clips or the like because the adhesion is maintained until the parts are separated. After the part (wafer 14) is mounted, the platen (heat sink 12) is transferred to the processing equipment where it is properly thermally grounded. That is, if the platen 12 is insufficient to maintain the desired thermal status, an auxiliary heat sink (such as, but not limited to, fixture 12) can be utilized. The auxiliary heat sink can include water cooled fins, tubes, plates or the like whereby extensive heat sinking can occur during the fabrication process.

After completion of the processing, platen 12, with wafer 14 attached, is returned to mounting fixture 10 and clamped in place. Valve 22 is opened thereby permitting pressure from line 26 to be exerted, through aperture 40, on the bottom of device wafer 14. This positive pressure is sufficient to cause device wafer 14 to float from heat sink 12 without damaging the wafer. Because the dry polymer film 16 leaves substantially no residue on wafer 14, there is no contamination or additional risk of physically damaging the device wafer upon demounting from the heat sink or subsequent cleaning.

Figure 3:
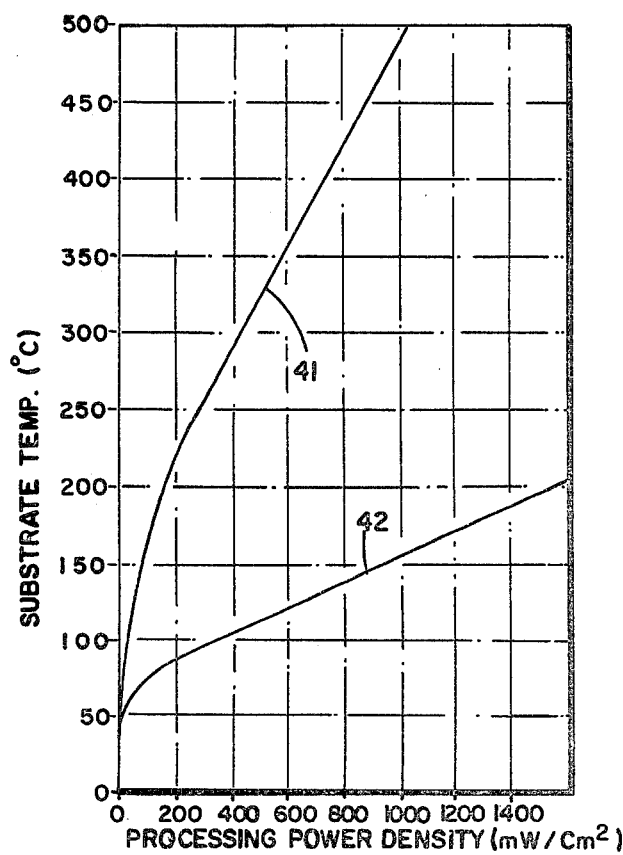
FIG. 3 illustrates the wafer substrate temperature versus processing power density at the wafer surface for wafers with and without thermal grounding.

Referring now to FIG. 3, there is illustrated the substrate temperature versus ion etching rates of a silicon wafer under several different conditions of heat removal. A device wafer which is merely placed on a flat copper heat sink can only radiate heat inasmuch as the wafer will, typically, be in "three-point" contact with heat sink 12. This heating is illustrated by curve 41 which closely approximates theoretical radiant cooling for a body of emissivity of about 0.5. A wafer being ion etched under these conditions can be etched at a maximum power density of about 30mW/cm$^2$ (about 30Å/min. for most materials) if the wafer temperature is to be kept under 100° C. to avoid degradation of the photoresist mask.

Use of vacuum grease or gallium permits heat removal by conduction through this contacting medium. If the contacting medium is uniformly applied, curve 42 shows that the processing power density can be increased to about 300mW/cm$^2$ (corresponding to an ion etching rate of about 300Å/min.) with the wafer temperature held under 100° C. However, use of grease, wax or liquid metal as the contacting agents has several serious disadvantages. The amount of labor required to apply and remove the medium from the wafer is extensive. Moreover, the inclusion of gas bubbles during application, the effects of non-uniform thickness and wetting, and the contamination of the wafer are severe drawbacks to this procedure. Even if there are no physical defects, the time required to effect these steps offsets the time gained by the higher etching rate. Thus, the net etching rate is not really improved. These problems can be avoided by using a tacky, inert, polymer film as described supra. Such a polymer film permits the processing to occur in accordance with curve 42 in FIG. 3. However, this polymer process avoids the contamination problems and the wafer clean-up problems. Also, as seen in the description of the wafer handling technique, mounting the wafer to the heat sink and dismounting after processing are steps requiring very little labor. Consequently, the improved etching (processing) rate is translated directly into improved yields and throughput.

The desired properties of the polymer heat transfer medium suggest the use of the elastomer group including such polymers as polyisobutylene, butyl latex, polychloroprene, butadiene-styrene copolymer, polyisoprene, and the silicone rubber family. These elastomers exhibit a certain amount of native "tack" and the ability to deform temporarily to conform to the shape of the part. The behavior of the elastomer material is, typically, modified for specific application by the addition of "tackifying" resins, fillers, softners, antioxidants, vulcanizing agents, and the like. For this application, high cohesive strength is desired to minimize contamination of the part, suggesting minimal employment of tackifiers to improve contact, and, as well, the employment of fillers, such as zinc oxide, to both increase tack and cohesive strength. Also, the elastomer and additives must be chosen to be relatively inert in the processing environment in which they are to be used. If the material is to be permanently bonded to the heat sink, the method of bonding must be carefully considered. Evaluation of surface energies will be useful to determine whether the polymer will adhere to the part or to the heat sink preferentially, if a free polymer film is used or a film initially applied to the part is used.

Another class of potentially useful polymers is the thermoplastics which can be induced to conform to the part and heat sink by raising the temperature and causing the polymers to melt. These polymers can be useful in transferring heat in the liquid state, and then, after processing, can be cooled and removed in the solid state. Again, separation from the part must be very clean to avoid contamination or additional cleaning procedures.

Thus, there is shown and described a preferred process and apparatus for handling of device wafers such that the temperature of the device is carefully controlled during processing. In the preferred embodiment, it is taught to secure a heat sink to a device wafer by means of a tacky inert polymer film on the heat sink surface, on the wafer, or as a thin polymer disk between the heat sink and wafer. The result is that the instant invention permits an increase in the processing rate during etching, implanting or the like without overheating the parts being fabricated thus lowering the cost of fabricating and processing device wafers. Variations to the process or apparatus may be suggested to those skilled in the art. These variations are intended to be included in the instant description. This description is intended to be illustrative only and not limitative of the invention. The scope of this invention is intended to be limited only by the claims appended hereto.

Having thus described a preferred embodiment of this invention, what is claimed is:

1. In combination,
   a thermally sensitive workpiece comprising a device wafer to be operated upon,
   a thermally conductive member for establishing a thermal condition, and
   a thermally conductive, chemically inert, dry, polymer layer interposed between said workpiece and said member to establish a uniform thermal contact between said workpiece and said member to control the thermal status of said workpiece when it is operated upon.

2. The combination recited in claim 1 wherein said polymer layer is formed on said workpiece.

3. The combination recited in claim 1 wherein said polymer layer is formed on said conductive member.

4. The combination recited in claim 1 including
   a mounting fixture means for holding said thermally conductive member,
   pressure means connected to said mounting fixture,
   said member having an aperture connected to said pressure means,
   said workpiece positioned over said aperture in said coated member such that said pressure means selectively forces said workpiece against said polymer layer thereby assuring intimate contact between said thermally conductive member and said workpiece and selectively releases said workpiece from said polymer layer without damage therefrom.

5. An apparatus as recited in claim 1, wherein said means for holding said heat conductive member includes clamping means.

6. An apparatus as recited in claim 1 wherein said polymer layer is applied to the top surface of said thermally conductive member by silk screening.

7. A process for heat removal from parts during processing comprising the steps of:
   mounting a heat conductive member having an aperture on a supporting fixture,
   coating the top surface of said heat conductive member with a dry, chemically inert, polymer film,
   positioning a part over the top surface of said coated heat conductive member,
   applying a vacuum through said aperture of said conductive member for bringing said part into intimate contact with said heat conductive member, and
   applying a positive pressure to said part through said aperture in said heat conductive member for releasing said part from contact with said heat conductive member.

8. The combination recited in claim 1 wherein said device wafer while in intimate contact with said thermally conductive member via said polymer layer permits an ion milling rate in excess of 1000 Å per minute.

9. The combination recited in claim 1 wherein said device wafer, while in intimate contact with said thermally conductive member via said polymer layer permits processing power densities at the wafer surface of greater than 300 milliwatts/cm$^2$ while maintaining the temperature of said device wafer below 100° C.

10. The combination recited in claim 1 wherein said thermally conductive polymer is an elastomer.

11. The combination recited in claim 1 wherein said thermally conductive polymer is a thermoplastic.

12. The combination recited in claim 7 wherein
    said part is maintained at a prescribed temperature by controlling the thermal status of said heat conductive member.

* * * * *